United States Patent [19]
Harrand et al.

[11] Patent Number: 5,590,070
[45] Date of Patent: Dec. 31, 1996

[54] DYNAMIC MEMORY

[75] Inventors: Michel Harrand, Saint Egreve; Michel Runtz, Grenoble, both of France

[73] Assignee: SGS-Thomson Microelectronics S.A., Saint Genis Pouilly, France

[21] Appl. No.: 465,810

[22] Filed: Jun. 6, 1995

Related U.S. Application Data

[62] Division of Ser. No. 240,144, May 10, 1994.

[30] Foreign Application Priority Data

May 24, 1993 [FR] France ................................. 93 06533

[51] Int. Cl.[6] ............................................. G11C 11/24
[52] U.S. Cl. .......................... 365/149; 365/210; 365/203; 365/189.07
[58] Field of Search ................................. 365/149, 210, 365/203, 207, 189.07

[56] References Cited

U.S. PATENT DOCUMENTS

| | | |
|---|---|---|
| 4,363,111 | 12/1982 | Heightley et al. . |
| 4,484,312 | 11/1984 | Nakano et al. . |
| 4,547,868 | 10/1985 | Childeis et al. . |
| 4,831,591 | 5/1989 | Imazeki et al. . |
| 4,961,166 | 10/1990 | Sato, et al. . |
| 5,343,433 | 8/1994 | Duvvury ................................. 365/149 |
| 5,351,210 | 9/1994 | Saito . |
| 5,392,240 | 2/1995 | Muraoka ................................. 365/149 |
| 5,410,509 | 4/1995 | Morita ................................... 365/149 |

OTHER PUBLICATIONS

French Search Report from French Patent Application No. 93 06533, filed May 24, 1993.

*Primary Examiner*—David C. Nelms
*Assistant Examiner*—Huan Hoang
*Attorney, Agent, or Firm*—David M. Driscoll; James H. Morris

[57] ABSTRACT

A dynamic memory includes a plurality of cells including capacitors connected by columns to bit lines and by rows to selection lines. An even row and an odd row contain reference cells, the cells of the other rows being memory cells. The capacitors of the reference cells have the same value as the capacitors of the memory cells. Means are also provided for, prior to reading a memory cell of an even row, connecting the selection line of the odd row of reference cells to an element having the same capacitance as a selection line, but which is precharged at the state opposite to the state of the selection line of the odd row of the reference cells.

20 Claims, 3 Drawing Sheets

5,590,070

DYNAMIC MEMORY

This application is a division of application Ser. No. 08/240,144, filed May 10, 1994, entitled DYNAMIC MEMORY, now pending.

BACKGROUND OF THE INVENTION

1. Field of the Invention

The present invention relates to dynamic memories, and more particularly to dynamic memories including dummy or reference cells.

2. Discussion of the Related Art

FIG. 1 partially represents such a dynamic memory that includes a plurality of memory cells, each including an N-channel MOS transistor MN or MN' to connect a capacitor C between a reference potential, such as ground, to a bit line BL or BL'. The cells are disposed in columns, corresponding to the bit lines BL and BL', and in rows. The columns are grouped by pair. Hereinafter, an "even" element is an element associated with any column of a pair, and an "odd" element is an element associated with the other column of the pair.

An even row of cells includes cells MN/C that are connected only to the even bit lines BL. An odd row of cells includes cells MN'/C that are connected only to the odd bit lines BL'. The gates of transistors MN or MN' of a row are connected to a selection line RW or RW', respectively.

The lines BL and BL' of a pair of columns are connected to a high voltage Vdd through P-channel MOS transistors, MP1 and MP1', respectively, and to ground through N-channel MOS transistors, MN1 and MN1', respectively. The gates of transistors MP1 and MP1' are connected to a precharge line P, and the gates of transistors MN1 and MN1' are connected to a write line W. Each pair of columns is associated with specific lines P and W to select the pair of columns. Additionally, each pair of lines BL and BL' is connected to the input of a comparator 10.

In the rectangle 12 drawn in dotted lines are represented so-called dummy or reference even and odd rows of cells. These reference cells are identical to the preceding cells, except that their capacitance, C/2, has half the value of capacitors C. The transistors of the even row of reference cells are labeled MND, and their gates are connected to a selection line RWD. The transistors of the odd row of reference cells are labeled MND', and their gates are connected to a selection line RWD'.

To write a "0" in a cell, the corresponding line RW or RW' and line W of the corresponding column pair are activated. Lines BL and BL' go to 0 and the capacitor C of the enabled cell is discharged.

To write a "1" in a cell, the corresponding line RW or RW' and the line P of the corresponding column pair are activated. The voltage on lines BL and BL' goes to Vdd and the capacitor C of the enabled cells is charged at voltage Vdd, at approximately the threshold voltage of transistors MN or MN'.

Prior to reading a cell, capacitors C/2 of the reference cells are discharged. This can be achieved by writing a series of "0" in these cells.

Then, to read the memory cell, for example an even cell, lines BL and BL' of the corresponding pair of columns are first precharged at voltage Vdd by activating the associated line P. Lines BL and BL' have high value capacitors that are thus charged at voltage Vdd. Then, the selection line RW of the even row including the even cell to be read is activated simultaneously with selection line RWD' of the odd reference cells. Thus, a capacitor C is connected to line BL, and a capacitor C/2 is connected to line BL'. Since capacitor C/2 was previously discharged, a charge is transferred from line BL' to the reference capacitor C/2. The capacitance of line BL' has a high value as compared with the value of capacitor C/2, and the voltage on this line drops by approximately 100 mV only.

If the capacitor C of the cell to be read is charged, that is, if the cell is at "1", the state of line BL does not change. Thus, the voltage on line BL' is lower than the voltage on line BL, and comparator 10 switches to a first state indicating that the cell that is read is at "1".

If the capacitor C of the read cell is discharged (the cell is at "0"), a charge is also transferred from line BL to capacitor C. Since the value of capacitor C is twice the value of capacitor C/2 of the reference cell, the voltage drop on line BL is twice as high as that on line BL'. Thus, the voltage on line BL becomes lower than the voltage on line BL' and comparator 10 switches to a second state indicating that the cell that is read is at "0".

One of the difficulties for the manufacturing of such a dynamic memory lies in the implementation of a sufficiently precise ratio between capacitors C and capacitors C/2. In technologies intended to fabricate dynamic memories only, studies and tests have overcome this difficulty by establishing design rules for the capacitors C and C/2. However, when these rules are applied to distinct technologies, unlike results are obtained, to such an extent that capacitors C and C/2 may have close values. This situation is particularly impairing if it is desired to include dynamic memories in various circuits, that are not exclusively intended to serve as memories, such as circuits for the processing of signals, since these various circuits can be fabricated in a plurality of distinct technologies to which the same design rules of capacitors cannot be applied.

SUMMARY OF THE INVENTION

An object of the invention is to provide a dynamic memory including reference cells, whose structure can be used, without adaptation, in any technology.

These and other objects are achieved by replacing the capacitors of the reference cells with capacitors having the same value as the capacitors of the memory cells and by charging these reference capacitors, before a read operation, at a voltage close to half the supply voltage. The invention more particularly provides specific means for charging the reference capacitors at the desired value.

The present invention more particularly provides a dynamic memory including: a plurality of cells including capacitors connected by columns to bit lines and by rows to selection lines, an even column of each pair of columns containing cells of respective even rows, and an odd column of each pair of columns containing cells of respective odd rows; an even row and an odd row containing reference cells, the cells of the other rows being memory cells; means for precharging the bit lines at a predetermined state before reading; means for selecting, when reading, the odd row of the reference cells simultaneously with any one of the even rows of the memory cells; and a comparator associated with each pair of columns, receiving the two bit lines of the pair of columns. According to the invention, the capacitors of the reference cells have the same value as the capacitors of the memory cells; means are also provided for, prior to reading a memory cell of an even row, connecting the selection line of the odd row of reference cells to an element having the same capacitance as a selection line, but which is precharged at the state opposite to the state of the selection line of the odd row of the reference cells.

According to an embodiment of the invention, said element is a dummy selection line having the same characteristics as the other selection lines.

According to an embodiment of the invention, the memory includes two first transistors to connect respectively the selection lines of the reference cells to the dummy selection line, and means to control either one of these first transistors when the bit lines are precharged.

According to an embodiment of the invention, the memory includes second transistors to initialize the capacitors of the reference cells, and means to control the second transistors of the odd row of reference cells once an arbitrary even row of memory cells has been selected.

According to an embodiment of the invention, the memory includes, for each selection line of the reference cells, third and fourth transistors to respectively restore this selection line to an active or an inactive state, and means to control the third transistor of the odd row when an even row of memory cell is selected, and to control the fourth transistor of the odd row once the even row of the memory cells has been selected.

According to an embodiment of the invention, the memory includes a fifth transistor to restore the dummy selection line to an active state, and means to control this fifth transistor when an arbitrary row is selected.

The foregoing and other objects, features, aspects and advantages of the invention will become apparent from the following detailed description of the present invention when taken in conjunction with the accompanying drawings.

DETAILED DESCRIPTION

Figure 1:
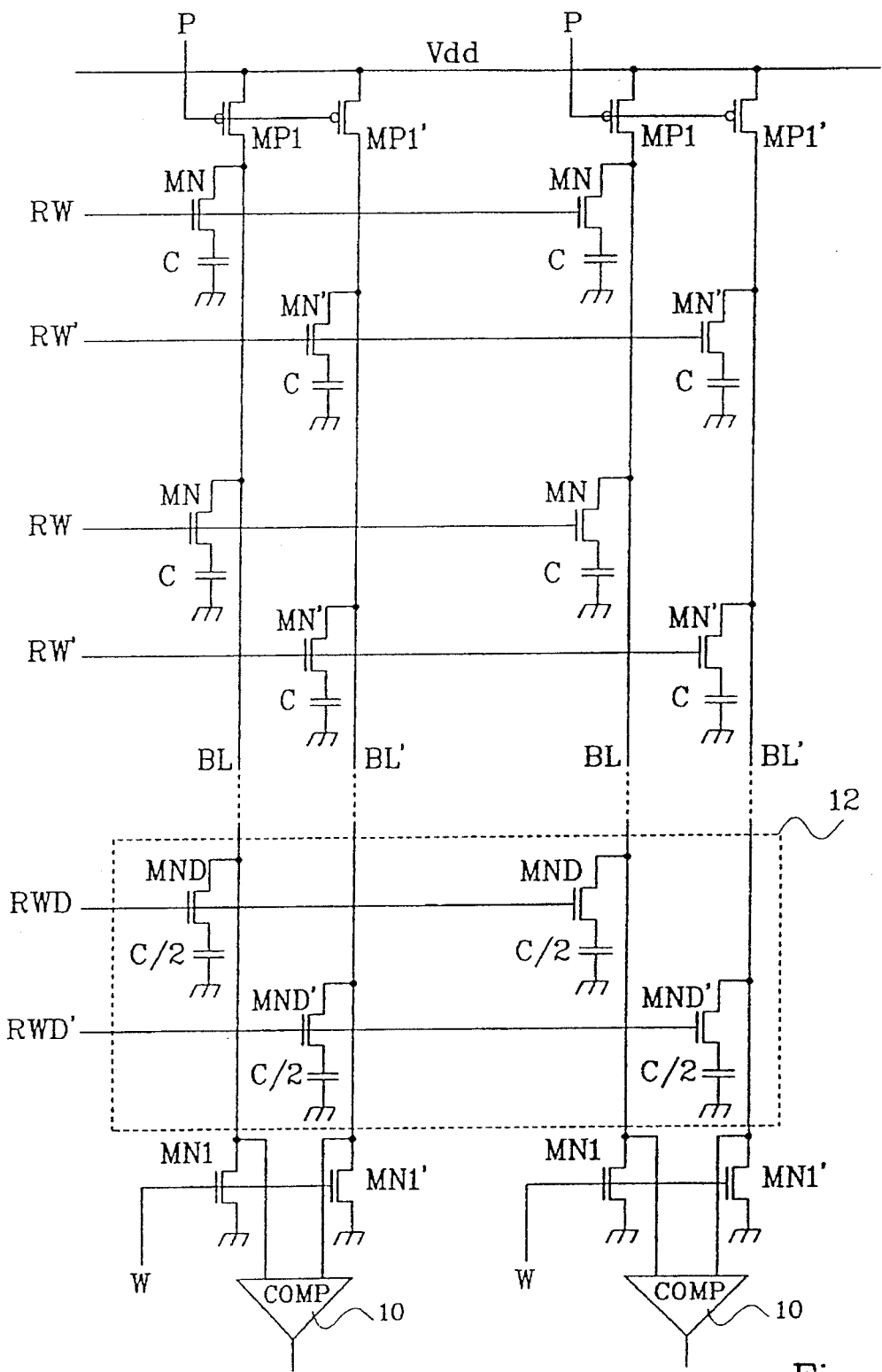
FIG. 1, above described, partially represents a structure of a conventional dynamic memory.

FIG. 2 shows again some of the components of FIG. 1, that are labeled with the same reference characters. According to the invention, in each reference cell, surrounded by a square 20 drawn in dotted lines, capacitor C/2 is replaced with a capacitor C having the same value as the capacitors of the other memory cells. One can very easily implement in an integrated circuit capacitors having identical values. Generally, it is merely sufficient that the capacitors have the same shape and the same size.

With the two selection lines RWD and RWD' of the reference cells is associated a dummy selection line REF that has the same capacitive characteristics as lines RWD and RWD'. For this purpose, line REF is connected to the gates of the unused transistors MR that are identical to transistors MND and MND'. A transistor MR is provided on line REF for each pair of columns. The drain and source of transistors MR are grounded.

To charge the capacitors of the reference cells at a value Vdd/2, the invention provides for previously discharging them, then charging line REF at voltage Vdd, and then connecting this line REF to line RWD or RWD', which is charged at potential 0. The charges get balanced between lines REF and RWD or RWD' and, since they have the same capacitance, their respective voltages are set to Vdd/2. Transistors MND and MND' are connected as transistor followers and their gate voltage Vdd/2 is applied onto their capacities C, disregarding the threshold voltage of transistors MND and MND'.

Voltage Vdd/2 could be applied to the gate of transistors MND or MND' through a resistor bridge. However, a resistor is cumbersome and difficult to implement in MOS technology, which is the technology used for dynamic memories. Additionally, such a resistor bridge would consume an undetermined quiescent current that is variable for various circuits. In CMOS technology, it is desired to avoid consumption of quiescent current since one of the means to sense a defective CMOS circuit is to detect whether it consumes current in the quiescent state.

The reference cells further include transistors (labeled MC for the even reference cells and MC' for the odd reference cells) connected in parallel with capacitors C. The gates of transistors MC are controlled through clear lines CLR, and the gates of transistors MC' are controlled through a clear line CLR'. Of course, transistors MC and MC' must not affect the value of capacitors C that they control. For this purpose, transistors MND and MC (or MND' and MC') of a reference cell are disposed on both sides of the electrodes of capacitor C, along the electrode plane.

Figure 2:
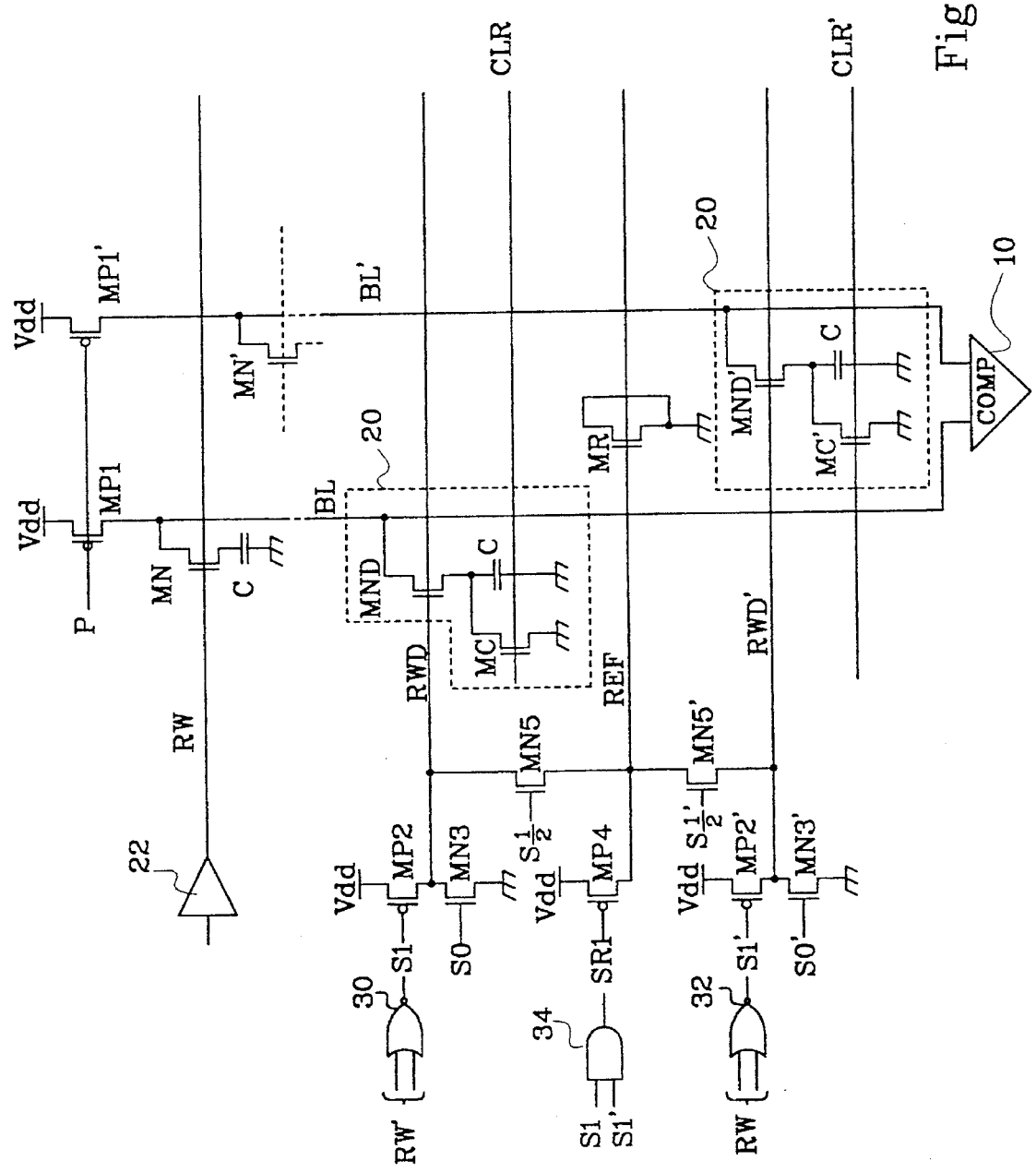
FIG. 2 partially represents a structure of an embodiment of a dynamic memory according to the invention.

FIG. 2 also represents components for controlling the various selection lines. The selection lines RW and RW' are conventionally controlled through a transistor follower 22, in turn controlled through a conventional decoding circuit (not shown). Line RWD is connected to voltage Vdd through a transistor MP2 and to ground through a transistor MN3. The gates of transistors MP2 and MN3 are controlled by lines S1 and S0, respectively. Similarly, line RWD' is connected to the high voltage Vdd through a transistor MP2' and to a low voltage through a transistor MN3'. The gates of transistors MP2' and MN3' are controlled by lines S1' and S0', respectively. The dummy selection line REF is connected to the high voltage Vdd through a transistor MP4 having its gate controlled by a line SR1. A transistor MN5 interconnects lines RWD and REF, and a transistor MN5' interconnects lines RWD' and REF. The gates of transistors MN5 and MN5' are controlled by lines $S_{1/2+cc}$ and $S_{+c,fra\ 1/2}'$.

Figure 3:
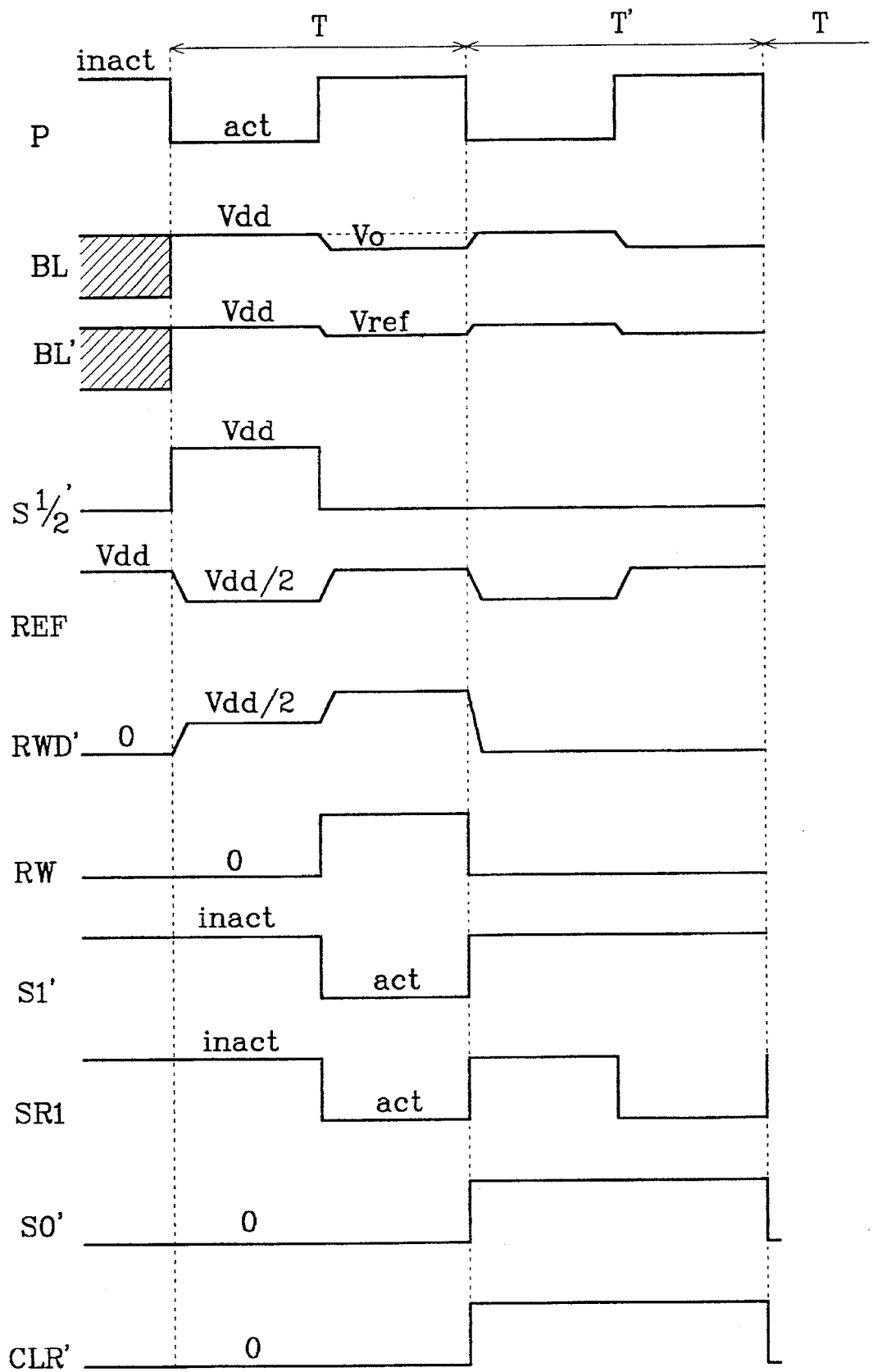
FIG. 3 is a timing diagram of read cycles of cells in a dynamic memory according to the invention.

FIG. 3 represents the states of the various lines of the circuit of FIG. 2 during two successive read cycles occurring during respective time intervals T and T'. Interval T corresponds to a read cycle of an even cell, and interval T' corresponds to a read cycle of an odd cell.

According to an embodiment of the invention, data in a dynamic memory provided with reference cells are read by alternatively reading even cells and odd cells. A read cycle is partitioned into a precharging step of bit lines BL and BL', and into an actual read step.

During the precharging cycle, at the beginning of interval T, line P is set to an active level ("0"). As a result, the bit lines BL and BL' are charged at voltage Vdd (the initial state of lines BL and BL' is arbitrary).

During this precharging phase, line $S_{1/2}'$ is also activated, which interconnects the dummy selection line REF and the selection line RWD'. Initially, line REF was at voltage Vdd and line RWD' was at voltage 0, in which both were floating. As a result, during this precharging phase, the voltage of line REF drops to Vdd/2 while the voltage of the selection line RWD' increases up to Vdd/2, because these two lines have the same capacitance. Since the transistors of the reference cells are disposed as transistor followers, capacitor C of the selected odd reference cell charges at Vdd/2, disregarding the threshold voltage of transistor MND'.

Then, the read phase starts with the deactivation of the precharging line P and activation of the selection line RW of the even row including the cell to be read. Simultaneously as line RW is activated, line S1' is also activated, which causes line RWD' to go to voltage Vdd. The capacitor C of the cell to be read is connected to line BL, and the capacitor C of the reference cell is connected to line BL'; lines BL and BL' are floating but were previously charged at voltage Vdd during the precharging phase.

If the capacitor C of the even cell to be read was already charged at Vdd (the cell was at "1"), the voltage on line BL does not vary, as represented in dotted lines. In contrast, if capacitor C was discharged, the charges are balanced between capacitor C and line BL, and the voltage on line BL drops down to a voltage V0 that is lower by a few hundred mV than voltage Vdd.

Simultaneously, the charges of line BL' and of capacitor C of the odd reference cell are balanced. However, since the voltage across the capacitor of the reference cell was substantially at Vdd/2, the voltage on line BL' drops down to a voltage Vref substantially at half way between voltage Vdd and voltage V0.

The comparator 10, that receives lines BL and BL', switches to a first state if the read cell was at "1", since, then, the voltage on line BL was higher than voltage Vref, or switches to a second state if the read cell was at "0", since, then, the voltage on line BL was lower than voltage Vref.

During the read phase, line SR1 is also activated, which restores the initial state of the dummy selection line REF to voltage Vdd. Signal SR1 is activated at each read phase, during the read phase of an even cell or of an odd cell.

A read cycle T' of an odd cell, which is for example in the same pair of columns as the even cell that has just been read, starts upon the end of cycle T. Signals P, BL, BL', REF and SR1 are similar to the signals of the preceding cycle T.

During cycle T', signals $S_{1/2}$', RWD', RW and S1' remain inactive; and signals $S_{1/2}$', RWD, RW' and S1 (not shown), respectively, similarly operate.

At the end of each read cycle, for example of cycle T, line RWD' must be restored to its inactive state "0" by activating signal S0' during the next cycle T'. Additionally, still for cycle T, the capacitor C of the reference cell that has just been used must be discharged by activating the clear line CLR' during the next cycle T'.

The clearing transistors MC are particularly useful since these transistors discharge the capacitors C of the reference cells, for example of the even cells, while the odd reference cells are used to read the even memory cells. This allows the chaining of two read cycles without any latency time. The clearing transistors can be omitted, but, then, the capacitors of the reference cells must be discharged by writing a "0" in these cells, which is a loss of time.

The fabrication of a decoder to provide the control signals of the reference cells according to the invention will clearly appear to those skilled in the art. For example, as represented in FIG. 2, signal S1 is obtained with a NOR gate 30 combining all signals RW'; signal S1' is obtained with a NOR gate 32 combining all signals RW; and signal SR1 is obtained with an AND gate 34 combining signals S1 and S1'. Signals $S_{1/2}$' and $S_{1/2}$' are obtained by combining the precharging signal P and a signal (not described) conventionally serving to indicate whether even cells or odd cells are read. Signals S0' and CLR' can equal the signal serving to indicate an even or odd read phase, or can be obtained by halving the frequency of signal SR1.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto:

What is claimed is:

1. A dynamic memory device, comprising:

memory means for storing a memory voltage having one of a first value and a second value, the memory means having a first capacitance;

reference means for storing a reference voltage, the reference means having a second capacitance substantially equal to the first capacitance of the memory means, the reference voltage being determined by the second capacitance;

comparing means for comparing the memory voltage with the reference voltage, the comparing means including first input means for receiving voltage, second input means for receiving voltage, and output means for outputting voltage, wherein the memory means and the reference means are coupled to the first input means and the second input means, respectively, and the output means outputs an output voltage according to the memory voltage and the reference voltage;

first connecting means interconnected between the memory means and the first input means;

second connecting means interconnected between the reference means and the second input means, wherein the first connecting means has a third capacitance, and the second connecting means has a fourth capacitance substantially equal to the third capacitance of the first connecting means, wherein the reference means is constructed and arranged to provide a first reference voltage, and wherein the second connecting means is constructed and arranged to provide a second reference voltage; and means for enabling the second connecting means such that the first reference voltage is increased to a third reference voltage when the second connecting means is enabled.

2. A device according to claim 1, wherein the first reference voltage is approximately equal to half the first value of the memory voltage.

3. A device according to claim 1, wherein the second reference voltage is approximately equal to the first value of the memory voltage.

4. A device according to claim 1, further including a first capacitance element coupled to the reference means such that the reference means stores the first reference voltage according to a charging voltage stored in the first capacitance element.

5. A device according to claim 4, further including:

a second capacitance element coupled to the first capacitance element; and means for connecting the first capacitance element to the second capacitance element.

6. A dynamic memory device, comprising a memory capacitor for storing a memory voltage having one of a first value and a second value, the memory capacitor having a first capacitance;

a reference capacitor for storing a reference voltage, the reference capacitor having a second capacitance substantially equal to the first capacitance of the memory capacitor, the reference voltage being determined by the second capacitance;

a comparator for comparing the memory voltage with the reference voltage, the comparator including a first input for receiving voltage, a second input for receiving voltage, and an output for outputting voltage; wherein the memory capacitor and the reference capacitor are coupled to the first input and the second input, respectively, and the output outputs an output voltage according to the memory voltage and the reference voltage;

a first bit line interconnected between the memory capacitor and the first input of the comparator;

a second bit line interconnected between the reference capacitor and the second input of the comparator, wherein the first bit line has a third capacitance, and the second bit line has a fourth capacitance substantially equal to the third capacitance of the first bit line, wherein the reference capacitor is constructed and arranged to provide a first reference voltage, and wherein the second bit line is constructed and arranged to provide a second reference voltage; and a selection line for enabling a connection between the reference capacitor and the second bit line such that the first reference voltage is increased to a third reference voltage when the selection line enables the connection.

7. A device according to claim 6, wherein the first reference voltage is approximately equal to half the first value of the memory voltage.

8. A device according to claim 6, wherein the second reference voltage is approximately equal to the first value of the memory voltage.

9. A device according to claim 6, further including a first capacitance element coupled to the reference capacitor such that the reference capacitor stores the first reference voltage according to a charging voltage stored in the first capacitance element.

10. A device according to claim 9, further including
a second capacitance element coupled to the first capacitance element; and
a transistor for connecting the first capacitance element to the second capacitance element.

11. A method for reading a memory cell of a dynamic memory device comprising the steps of:

providing a memory voltage from the memory cell, the memory voltage having one of a first voltage value when the memory cell stores a first logic value, and a second voltage value when the memory cell stores a second logic value;

providing a reference voltage from a reference cell, the reference voltage having a third voltage value that is less than the first voltage value;

holding the provided memory voltage substantially constant at the first voltage value when the memory cell stores the first logic value, and adjusting the provided memory voltage to a fourth voltage value when the memory cell stores the second logic value, the fourth voltage value being less than the third voltage value;

comparing, after the step of holding and adjusting, the memory voltage with the reference voltage; and outputting an output voltage according to the compared memory voltage and the compared reference voltage.

12. A method according to claim 11, wherein the step of holding and adjusting includes a step of connecting a memory capacitor of the memory cell that stores the memory voltage with a first capacitance device initially charged to the first voltage value such that the memory voltage is held substantially constant when the memory capacitor initially has the first voltage value, and is changed to the fourth voltage value when the memory capacitor initially has the second voltage value.

13. A method according to claim 12, wherein the step of providing the reference voltage includes a step of connecting the reference cell to a second capacitance device, the reference cell being initially charged to substantially half of the first voltage value, and the second capacitance device being initially charged to substantially the first voltage value to provide the reference voltage having the third voltage value.

14. A method according to claim 13, further comprising a step of:

applying a charging voltage substantially equal to half of the first voltage value to a transistor coupled to the reference capacitor, and configured as a transistor follower such that the reference capacitor is charged to substantially half of the first voltage value.

15. A dynamic memory device, comprising:

a memory cell to store a memory voltage initially having one of a first voltage value and a second voltage value;

a memory line;

a memory switching device coupled between the memory cell and the memory line to switchably connect the memory cell to the memory line such that, when the memory cell and the memory line are connected, the memory voltage is held constant if it is initially at the first voltage value, and is adjusted to a third voltage value if it is initially at the second voltage value;

a reference cell;

a reference line;

a reference switching device coupled between the reference cell and the reference line; and a comparing device having a first input coupled to the memory line, a second input coupled to the reference line, and an output to provide a signal according to the memory voltage when the memory switching device connects the memory line to the memory cell.

16. A device according to claim 15, wherein the memory switching device is a memory transistor, wherein the reference switching device is a reference transistor, and wherein the reference transistor has a gate terminal and is configured as a transistor follower such that a charging voltage substantially equal to a fourth voltage value applied to the gate activates the reference transistor to charge the reference cell to substantially the fourth voltage value.

17. A device according to claim 16, further comprising:

a charging circuit coupled to the gate of the reference transistor to provide the charging voltage substantially equal to the fourth voltage value being substantially equal to half of the first voltage value.

18. A device according to claim 17, wherein the charging circuit includes:

a first capacitance line coupled to the gate of the reference transistor, and having a first capacitance;

a second capacitance line having a second capacitance substantially equal to the first capacitance; and a third switching device coupled between the first capacitance line and the second capacitance line such that first capacitance line is initially discharged, the second capacitance line is initially charged to the first voltage value, and the first capacitance line provides the charging voltage to the gate of the reference transistor when the third switching device connects the first capacitance line to the second capacitance line.

19. A device according to claim 17, further comprising:

a switching circuit coupled to the gate of the reference transistor to activate the reference transistor such that the reference line is connected to the reference cell to provide on the reference line a reference voltage having a value between the first voltage value and the third voltage value.

20. A device according to claim 19, further comprising:

precharging circuitry coupled to the memory line and the reference line to precharge the memory line and the reference line to the first voltage value.

* * * * *